United States Patent [19]

Tarrant

[11] Patent Number: 5,335,186
[45] Date of Patent: Aug. 2, 1994

[54] INTELLIGENT PROGRAMMABLE SENSING

[75] Inventor: Richard T. Tarrant, Richardson, Tex.

[73] Assignee: Texas Instruments Incorporated, Dallas, Tex.

[21] Appl. No.: 530

[22] Filed: Jan. 4, 1993

Related U.S. Application Data

[63] Continuation of Ser. No. 890,326, May 26, 1992, abandoned, which is a continuation of Ser. No. 502,353, Mar. 30, 1990, abandoned.

[51] Int. Cl.$^5$ ............................................. G06F 15/46
[52] U.S. Cl. ................................. 364/550; 340/825.06
[58] Field of Search .................. 364/550, 551.01, 557, 364/505, 579, 580; 340/825.06

[56] References Cited

U.S. PATENT DOCUMENTS

| | | | |
|---|---|---|---|
| 3,882,305 | 5/1975 | Johnstone | 364/551.02 |
| 4,184,205 | 1/1980 | Morrow | 364/550 X |
| 4,399,515 | 8/1983 | Gross | 364/557 X |
| 4,611,296 | 9/1986 | Niedermayr | 364/579 |
| 4,642,784 | 2/1987 | White, Jr. et al. | 364/551.01 |
| 4,745,564 | 5/1988 | Tennes et al. | 364/550 X |
| 4,831,558 | 5/1989 | Shoup et al. | 364/550 |
| 4,924,418 | 5/1990 | Bachman et al. | 364/550 |
| 4,958,139 | 9/1990 | Hyatt | 340/122 |
| 5,005,142 | 4/1991 | Lipchak et al. | 364/550 |

OTHER PUBLICATIONS

W. R. Iverson, *The Vendors Are Betting Their Chips on Silicon Sensors*, Electronics, Jul. 1989.

Milt Leonard, *IC Fabrication Techniques Sculpt Silicon Sensors*, Electronic Design, Oct. 26, 1989.

Bill Travis, *Silicon Pressure Sensors Gain Commodity Status*, EDN, at 8-10, Mar. 8, 1990.

Description of TLC 32040 and TLC 32041 Analog Interface Circuits, manufactured by Texas Instruments Incorporated (1987).

Description of TMS320 Family of 16/32 bit Single Chip Digital Processors Manufactured by Texas Instruments Inc. (Mar. 15, 1990).

*Primary Examiner*—Thomas G. Black
*Assistant Examiner*—Michael Zanelli
*Attorney, Agent, or Firm*—Ruben C. DeLeon; Richard L. Donaldson; William E. Hiller

[57] ABSTRACT

An apparatus (10) for intelligent programmable sensing using elements mounted on a silicon base comprise a silicon sensor transducer (12) and a configurable analog signal conditioner (16). A configurable memory (18) is part of signal conditioner (16) and stores conditioning instructions to direct configurable analog signal conditioner operations. A configurable memory (24) is part of configurable analog-to-digital converter (24) and stores converting instruction to direct configurable analog-to-digital converter operation. Digital signal processor (28) processes digitized signals (26) from configurable analog-to-digital converter (24). A program memory (30) stores program instructions for processor (28) to generate results (32). Configuration and results bus (34) directs communications within the sensor (10) and through communications interface (36). Communications interface (36) interfaces to system communications bus (38) to interconnect other intelligent programmable sensors (40,42) and supervisor monitor/control computer (44) which process results/reconfiguration memories (18,24,30).

27 Claims, 3 Drawing Sheets

AN INTELLIGENT, PROGRAMMABLE SENSOR AND RELATED SYSTEM

AN INTELLIGENT, PROGRAMMABLE SENSOR
AND RELATED SYSTEM

INTELLIGENT PROGRAMMABLE SENSING

This application is a continuation of application Ser. No. 07/890,326, filed May 26, 1992, which is a continuation of application Ser. No. 07/502,353, filed Mar. 30, 1990, both now abandoned.

TECHNICAL FIELD OF THE INVENTION

The present invention relates to intelligent programmable sensing in general, and more particularly to an apparatus and method for intelligently and programmably sensing physical variables using a silicon sensor.

BACKGROUND OF THE INVENTION

Throughout the world, sensors systems measure a broad spectrum of physical variables such as motion, acceleration, pressure, temperature, and flow. Some sensor systems incorporate digital electronic and computer technology. These types of sensor systems typically comprise a portion of the system that generates and processes analog signals and a portion that converts the analog signals to digital signals and further processes the digital signals. Sensing transducers directly measure the physical variables to generate the analog signals. Electronic circuits and digital processors convert the analog signals to digital signals and process the digital signals. Over the years, digital electronic components have become less expensive to design and manufacture. However, analog components have not enjoyed the same reductions in design and manufacturing costs. Therefore, a need exists for inexpensive analog sensing components for electronic sensor systems.

In recent years, electronic system designers have come to realize benefits inherent in distributed data processing systems. These electronic systems, in varying degrees, receive and process data at a remote site before sending the data to a central point for computer analysis and decision making. Benefits in distributed data processing systems include lower system costs and more rapid and complete data analysis. If an electronic sensor system could employ distributed data processing, then it could also realize these benefits. Thus, there is a need for an electronic sensor system that uses distributed data processing.

Silicon sensors comprise transducers that are fabricated from a silicon base. They have the potential to provide inexpensive analog sensing components that incorporate distributed data processing. Silicon transducers now exist that can produce analog signals to measure physical variables such as motion, acceleration, pressure, temperature, and flow. The advantages of silicon transducers are evident from a review of the following articles: W. R. Iversen, *The Vendors Are Betting Their Chips on Silicon Sensors*, ELECTRONICS, July 1989; and M. Leonard, *IC Fabrication Techniques Sculpt Silicon Sensors*, ELECTRONIC DESIGN, Oct. 26, 1989. To date, however, no one has come forward with a silicon sensor system that inexpensively provides distributed data processing.

Some designers have attempted to incorporate distributed data processing in silicon sensor systems by including a silicon sensor transducer, demodulator, sensor amplifier and voltage-to-frequency converter on a single silicon base. Other manufacturers choose not to incorporate all of the sensor electronic circuitry on the same piece of silicon. Instead they combine a silicon transducer and analog signal circuitry on a single silicon base and interconnect analog-to-digital conversion and other processing circuitry on an adjacent silicon base in a single electronic system package. While these applications represent improvements over prior technology, the way in which they apply signal conditioning and amplifying circuitry reduces the number of applications for the silicon sensors. This is because these sensors amplify and condition the analog signals to a fixed degree. These sensor systems have limited utility in applications requiring other degrees of analog signal conditioning.

Silicon sensor systems having a wider variety of potential uses can be produced more economically than such systems having only a limited number of uses. This is because manufacturers can produce more of them and spread out original design and development costs over a larger number of individual systems. Thus, manufacturers cannot mass produce silicon sensor systems that amplify and condition analog signals to only a fixed degree as inexpensively as systems having a wider variety of applications. This limitation causes those types of silicon sensor systems to be expensive, so they cannot satisfy the need of an inexpensive silicon sensor system that uses distributed data processing. Thus, there is yet the need for an inexpensive silicon sensor system that fully uses distributed data processing.

SUMMARY OF THE INVENTION

In view of the foregoing disadvantages inherent in known types of silicon sensor systems now present in the prior art, the present invention provides an intelligent, programmable silicon sensor system wherein a manufacturer can first fabricate the sensor and the user can later program it for a specific application. Moreover, once the sensor is in place the user can reprogram the sensor to refine its sensing parameters as needs dictate.

One aspect of the invention is a sensor which allows a manufacturer to design and fabricate a single device for many applications. The user can later program the sensor for a specific application. The intelligent programmable sensor of the present invention preprocesses raw data to increase overall system efficiency.

According to one aspect of the invention, the sensor includes a sensing transducer on a single silicon substrate base that generates an analog signal proportional to the physical variables it senses. A configurable analog signal conditioner receives the analog signal from the sensing transducer and amplifies, filters, and otherwise conditions the signal and directs the analog signal to a configurable analog-to-digital converter. The sensor transducer, configurable analog signal conditioner and digital converter reside on the same silicon base.

Another aspect of the present invention includes an intelligent programmable silicon sensor on a single silicon base that comprises a silicon sensor transducer which generates an analog signal proportional to the physical variables to which it responds. A configurable analog signal conditioner receives the analog signal that the sensing transducer generates and amplifies, filters, and otherwise conditions the analog signal. The signal conditioner directs this conditioned analog signal to a configurable analog-to-digital converter.

According to this aspect of the invention, the sensor system of the present invention further includes a configuration and results bus that communicates among the analog signal conditioner, the analog-to-digital converter, a program memory, a digital signal processor and a communications interface. These elements all reside on the same silicon base.

According to another aspect of the invention, the intelligent programmable sensor and related system comprise a plurality of intelligent sensors as described above, together with a supervisor monitor/control computer. The supervisor monitor/control computer communicates among the intelligent programmable sensors to program the operation of intelligent programmable sensor components as necessary to perform sensing functions according to the sensor system application.

A technical advantage of the present invention is that it provides a single silicon sensor that a manufacturer can fabricate and a user can program for the specific application.

Another technical advantage of the present invention is that it provides a device that the user can reprogram to provide different data under the control of real-time supervisory computer or by human intervention.

Yet another technical advantage of the present invention is that the user can install multiple sensors of the same type and program them to form a total system for complex or large scale sensor monitoring and control.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF THE INVENTION

Figure 1:
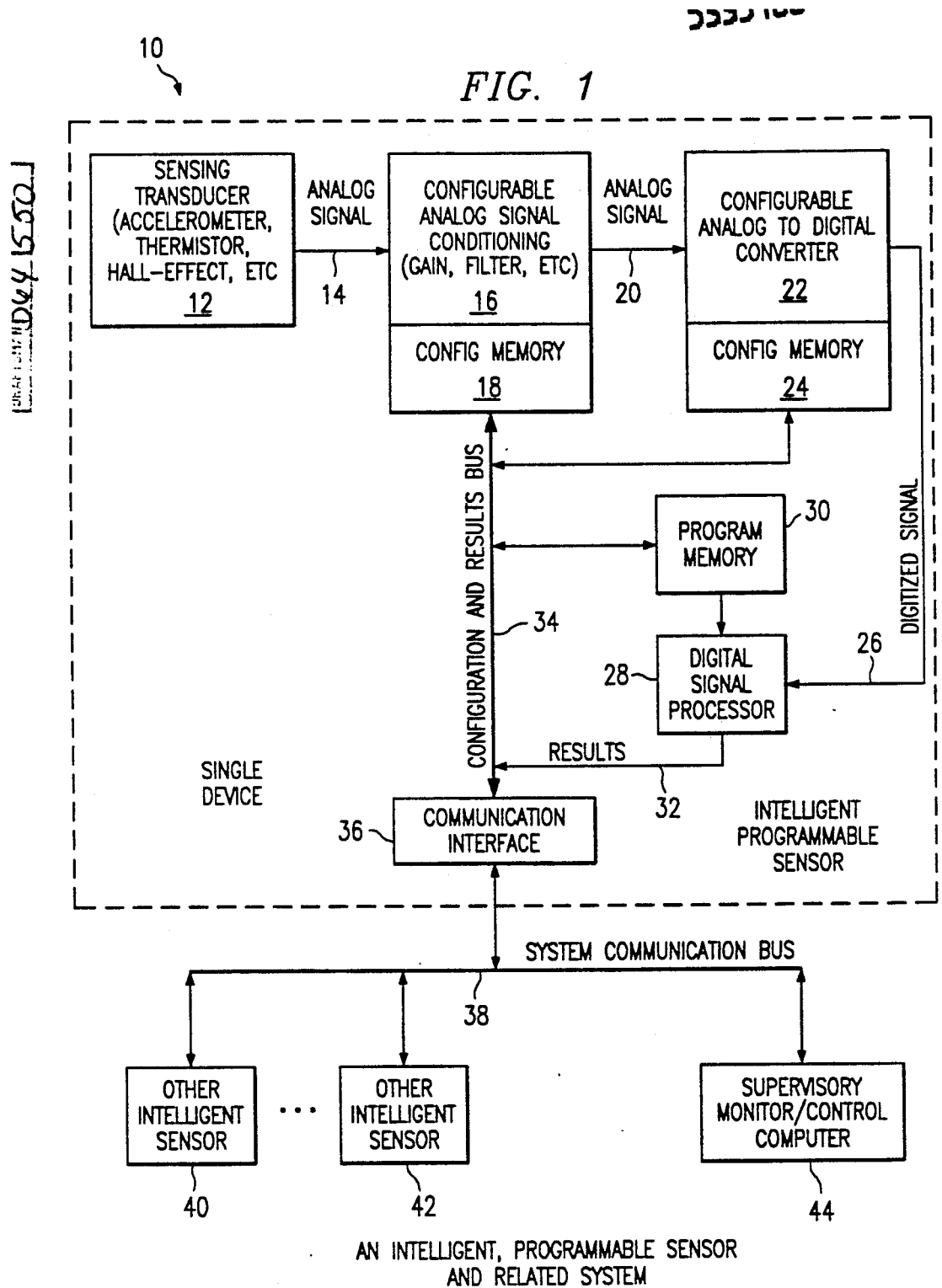
FIG. 1 illustrates a block diagram of the intelligent, programmable sensor and related system according to the present invention.
Figure 2:
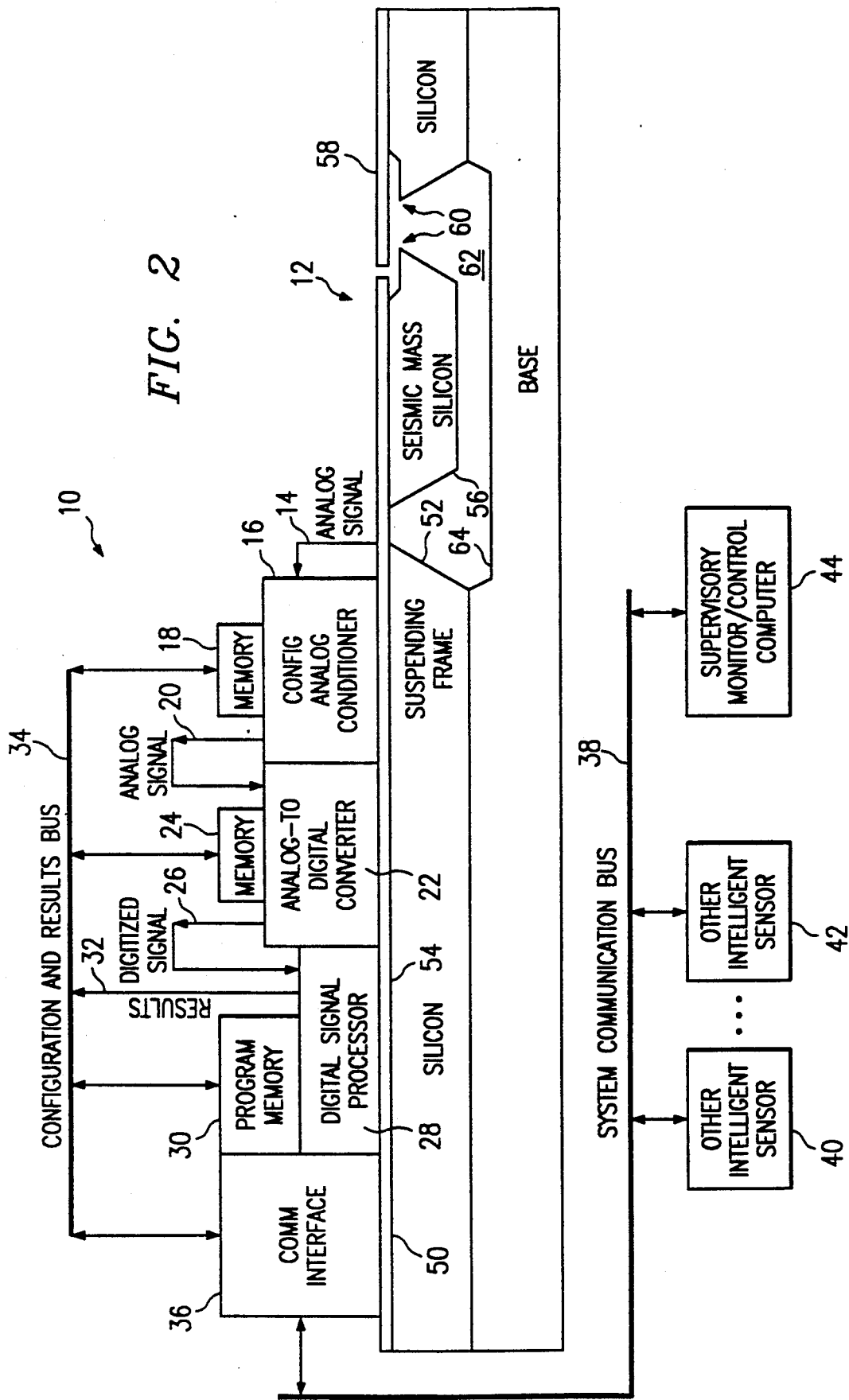
FIG. 2 is a combination side cut-away and block diagram of the apparatus illustrating placement of the intelligent programmable sensor components on a single silicon chip.
Figure 3:
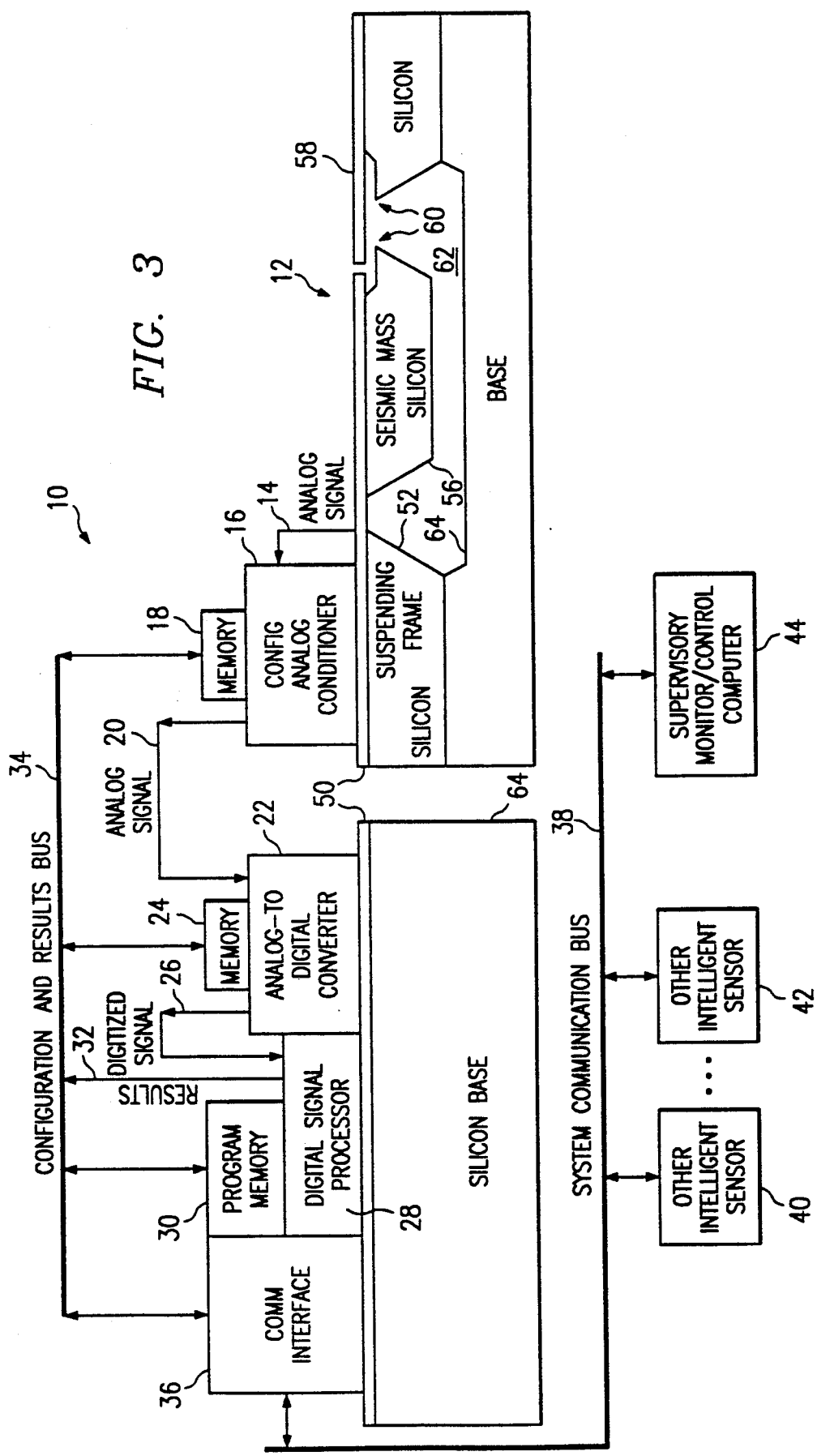
FIG. 3 shows an alternative embodiment of the present invention wherein the sensing transducer, configurable analog signal conditioner, and configurable analog-to-digital converter reside on a single silicon base.

FIGS. 1-3 of the drawings, in which like numerals indicate like and corresponding parts of the various drawings, aid in developing a complete understanding of preferred embodiments of the present invention.

FIG. 1 provides a block diagram of a preferred embodiment of an intelligent programmable sensor 10 according to the present invention. Intelligent programmable sensor 10 includes sensing transducer 12 that sends analog signal 14 to configurable analog signal conditioner 16. Configurable analog signal conditioning circuitry 16 includes configurable memory 18. Configurable analog signal conditioner 16 sends analog signal 20 to configurable analog-to-digital converter 22. Configurable analog-to-digital converter 22 includes configurable memory 24. Configurable analog-to-digital converter 22 generates digitized signal 26 and sends this signal to digital signal processor 28. Digital signal processor 28 also receives processing commands from program memory 30 and sends results 32 to configuration and results bus 34.

Configuration and results bus 34 sends configuration commands to configuration memory 18 and to configuration memory 24. Configuration and results bus 34 further sends instructions to program memory 30. Configuration and results bus 34 may also read existing configurations of configurable memories 18 and 24 and instructions in program memory 30. Configuration and results bus 34 communicates with communications interface 36. Communications interface 36 communicates with system communications bus 38. System communications bus 38 communicates among other intelligent sensors, including intelligent programmable sensor 40 and intelligent programmable sensor 42. System communications bus 38 also sends intelligent programmable sensor results, and configurable memory 18 and 24 and program memory 30 status to supervisor monitor/control computer 44. Supervisor monitor/control computer 44 sends program information to intelligent programmable sensor 10, as well as other intelligent sensors, including intelligent programmable sensors 40 and 42.

FIG. 2 shows a part cut-away side view/part block diagram for relating the configuration of the present invention. Silicon transducer 12 of FIG. 2 operates as silicon accelerometer. Devices such as these have use as crash-sensors for air bag development, motion sensors for active suspension systems. They also find use in aerospace and military applications.

The components as described with respect to FIG. 1 (as well as the inter-component signal flow) are shown as block diagram elements rigidly mounted as a single unit to sensing transducer 12. FIG. 2 further shows sensor transducer 12 as a cantilever design having one end of beam 50 remaining rigidly fixed to the silicon suspending frame 52 at interface 54 while the other end of beam 50 attaches to free swinging seismic mass 56. A series of flexible tabs 58 extends over underlying shelves 60 around three sides of seismic mass 56 to supply mechanical stops to prevent beam 50 from breaking during over-ranging in all three axis of motion. Gap 62 appears between seismic mass 56 and base 64 to provide over-range damage protection from resilient oscillations of seismic mass 56. The device completely exposes the top side of the intelligent programmable silicon sensor 10 to permit the addition of the remaining components of the present embodiment. These components may be implanted into silicon substrate 52.

Configurable analog signal conditioner 16 comprises conditioning circuitry and configurable memory 18. The conditioning circuitry may provide signal gain and, possibly, filtering. For example, signal conditioner 16 may include an integral amplifier together with a signal filter to reduce noise from sensing transducer 12. The intelligent programmable sensor of the present invention also may incorporate temperature compensation of analog signal 14 as a feature of analog signal conditioner 16. This would more accurately make analog signal 20 respond to sensing transducer 12 acceleration output without any adverse temperature effects from the sensor environment. Configurable memory 18 comprises a separate non-volatile memory. For example, configurable memory 18 could be a register that would change the gain of analog signal 14.

Configurable analog-to-digital converter 22 comprises analog-to-digital conversion circuitry and configurable memory 24. Configurable memory 24 stores operational commands that direct analog-to-digital converter 22 to sample analog signal 20 at a particular rate, and to convert that signal to digitized signal 26 at a certain rate. Also, these commands may program the number of bits of information that comprise digitized signal 26. Examples of analog-to-digital input/output systems that may perform the functions of analog-to-digital converter 22 are TLC32040 and TLC32041, manufactured by Texas Instruments Inc. of Dallas, Tex. These devices integrate a band pass switch-capacitor anti-alias input filter, a 14-bit resolution analog-to-digital converter, four microprocessor-compatible serial port modes, a 14-bit resolution digital-to-analog converter and a low pass switch capacitor output-reconstruction filter. Any device capable of performing the functions of TLC32040 or TLC32041 are satisfactory analog-to-digital converters.

Digitized signal processor 28 allows intelligent programmable sensor 10 to perform a number of different functions. Digitized signal processor 28 processes the data that digitized signal 26 carries according to instructions from programmable memory 30. The instructions from programmable memory 30 have their origin in supervisor monitor/control computer 44. Results 32, therefore, comprise digital data signals that have been processed according to instructions from supervisor monitor/control computer 44. Because results 32 are processed according to the control instructions from computer 44, intelligent programmable sensor system 10 supplies information to computer 44 that is much easier to process and much simpler to transmit over systems communications bus 38 than raw analog signal data from sensing transducer 12. Program memory 30 provides a standard non-volatile memory that allows the sensor device to retain its processing instructions and data output characteristics until reprogramming occurs.

The TMS320 family of 16/32-bit single-chip digital signal processors manufactured by Texas Instruments of Dallas, Tex., have digital signal processor cores that satisfy the requirements of digital signal processor 28. Digital signal processors from that family have a special digital signal processing instruction set that provides a digital signal processor capable of executing 12.8 million instructions per second. This execution rate generally handles the processing requirements of instructions from program memory 30 for most sensing applications. The preferred embodiment of the present invention may use, however, any digital signal processor capable of receiving input from program memory 30 and digitized signal 26 to generate results 32 and transmit those results to configuration and results bus 34.

Configuration and results bus 34 links communications interface 36 to various elements including configurable analog signal conditioner 16 and configurable analog-to-digital converter 22. Configuration and results bus 34 receives supervisor commands, including configuration commands and processing commands, from supervisor monitor/control computer 44 through communications interface 36. The configuration commands are sent by configuration and results bus 34 to configurable memory 18 and configurable memory 24. These configure analog signal conditioner 16 and analog-to-digital converter 22 according to the directives of supervisor computer 44 to change the way that signal conditioner 16 and analog-to-digital converter 22 condition analog signal 14 and convert analog signal 20, respectively.

Configuration and results bus 34 also operates to control the data processing of digital signal processor 28 and program memory 30. In response to results 32, supervisor computer 44 may direct that digital signal processor 28 process digitized signal 26 differently. In such event, supervisor computer 44 generates a different set of processing commands and sends these processing commands via systems communications bus 38 to communications interface 36. Communications interface 36 directs these commands over configuration and results bus 34 to program memory 30. Program memory 30 stores these different commands and sends them to digital signal processor 28. With these different commands, digital signal processor 28 processes digitized signal 26 to generate a different set of results 32 back to configuration and results bus 34. Finally, configuration and results bus 34 relays these different processed results 32 to supervisor computer 44 via communication interface 36 and systems communications bus 38. Thus, configuration and results bus 34 operates as the central data communications path with intelligent programmable sensor 10 of the present invention.

System communications bus 38 is a low-level communications bus that may be either a parallel or serial link among intelligent sensors, such as intelligent programmable sensors 40 and 42, and supervisor computer 44. Supervisor monitor/control computer 44 may be any data processing device capable of performing the monitor and control functions described above.

FIG. 3 shows an alternative embodiment of the present invention. That embodiment comprises, on a single silicon base, sensing transducer 12, configurable analog signal conditioner 16 and configurable memory 18. On a separate silicon base appear configurable analog-to-digital converter 22 with configurable memory 24, program memory 30, digital signal processor 28, configuration and results bus 34 and communication interface 36. This 2-chip configuration still provides a compact and highly integrated pair of devices of the intelligent programmable sensor 10 of the present invention. This embodiment also has the flexibility missing in prior silicon sensors. This embodiment also allows the user to program analog signal conditioner 16, both upon initial installation in the particular application and in real-time according to the user's analyses of results 32.

Referring now to the operation of the intelligent programmable sensor 10, the following describes a potential application of a silicon accelerometer sensor incorporating the present invention. In the field of machine diagnostics, machine operators use sensors to generate raw information that some human expert (or computer program) must interpret. These sensors, whether as silicon sensors or otherwise, produce massive amounts of data that document machine vibrations over time.

Intelligent programmable sensor 10 together with system communications bus 38 and supervisor monitor/control computer 44 of present invention permit removing the human expert from numerous machine diagnostic procedures. This is because intelligent programmable sensor 10 incorporates sufficient data processing capability for supervisor monitor/control computer 44 to store processed digital data, perform analyses, and make decisions necessary for machine diagnostic procedures. For such an application, supervisor monitor/ control computer 44 may reprogram intelligent programmable sensor 10 according to a decision making program within supervisor monitor/control computer 44. Thus, for a machine diagnostics application, if supervisor monitor/control computer 44 were to receive from digital signal processor 28 results 32 that indicate a machine is beginning to act abnormally by reaching certain operational set points, supervisor computer 44 may direct program instructions to program memory 30 to change the mode of digital signal processor 28 operation.

These different commands may, for example, direct digital signal processor 28 to take a closer look at a more refined frequency of machine vibration for the purpose of isolating a component that may be failing. At the same time, supervisor computer 44 may direct configurable memory 18 and configurable memory 24 to change the operation of analog signal conditioner 16 and analog-to-digital converter, respectively. For example, supervisor monitor/control computer 44 may direct analog signal conditioner 16 to increase the gain of analog signal 20 that it sends to analog-to-digital converter 22. Supervisor monitor/control computer 44, for example, may further direct analog-to-digital converter 22 to increase the bit rate of digitized signal 26. These changes increase the resolution and increase the frequency band width of vibration analyses for vibrations that transducer 12 senses. The results 32 that these changes yield may be critical to isolate a particular failing component before the component prohibits machine operation or could indicate an approximate estimated time before that component fails. Intelligent programmable sensor 10, therefore, can produce substantial improvements in machine diagnosis and operation.

Although this description describes the invention with reference to the above specific embodiments, the claims, and not this description limit the scope of the invention. Various modifications of the disclosed embodiment, as well as alternative embodiments of the invention will become apparent to persons skilled in the art upon reference to the above description. Therefore, the appended claims will cover such modifications that fall within the true scope of the invention.

By way of one example of a change in embodiment, system 38 can be, for example, a wireless transmission line so that a system can send instructions from remote locations.

What is claimed is:

1. An intelligent programmable sensing apparatus using elements mounted on at least one silicon base, said elements comprising:
   a transducer for sensing physical variables and generating a plurality of raw analog signals representing said sensed physical variables; and
   a configurable analog signal conditioner receiving said raw analog signals from said transducer, said configurable analog signal conditioner conditioning said raw analog signals to transmit conditioned analog signals, said configurable analog signal conditioner including:
      a first configurable memory for storing at least one signal conditioning instruction for directing said configurable analog signal conditioner, said first configurable memory being reprogrammable to contain different sets of signal conditioning instructions immediately at any time and being adapted for connection to an external programming device supplying the different sets of signal conditioning instructions.

2. The apparatus of claim 1 wherein said apparatus includes:
   a configurable analog-to-digital converter on said at least one silicon base for receiving said conditioned analog signals and converting said conditioned analog signals to a plurality of digitized signals.

3. The apparatus of claim 2, including a second configurable memory on said at least one silicon base and integral to said configurable analog-to-digital converter, said second configurable memory for storing at least one signal converting instruction for directing said configurable analog-to-digital converter, said second configurable memory being reprogrammable to contain different signal converting instructions immediately at any time and being adapted for connection to an external programming device supplying the different sets of signal converting instructions.

4. The apparatus of claim 3, including a digital signal processor on said at least one silicon base and in communication with said analog-to-digital converter for processing said digitized signals from said configurable analog-to-digital converter.

5. The apparatus of claim 4, including a program memory on said at least one silicon base and in communication with said digital signal processor for storing a plurality of program instructions for controlling digitized signal processing and directing said digital signal processor to process said digitized signals according to said program instructions, said program memory being reprogrammable to contain different program instructions for controlling and directing said digital signal processor immediately at any time and being adapted for connection to an external programming device supplying the different program instructions.

6. The apparatus of claim 5, including a configuration and results bus on said at least one silicon base and in communication with said first configurable memory of said analog signal conditioner, said second configurable memory of said analog-to-digital converter, said program memory, and said digital signal processor for directing communications throughout said intelligent programmable sensing apparatus.

7. The apparatus of claim 6 wherein said apparatus communicates with external circuitry and wherein said apparatus includes a communications interface residing on said at least one silicon base and in communication with said configuration and results bus for interfacing communication signals between said apparatus and said external circuitry.

8. The system of claim 5, wherein said configurable analog-to-digital converter, said second configurable memory, said digital signal processor, and said program memory are mounted in a single silicon base.

9. An intelligent programmable sensing apparatus using elements mounted on at least two silicon bases, comprising:
   a silicon sensor transducer integral to a first one of said silicon bases for sensing physical variables and generating a plurality of raw analog signals representing said sensed physical variables; and
   a configurable analog signal conditioner also mounted on said first silicon base for receiving said raw analog signals from said transducer, said configurable analog signal conditioner conditioning said raw analog signals and transmitting conditioned analog signals, said configurable analog signal condition including:
      a first configurable memory for storing at least one signal conditioning instruction for directing operations of said configurable analog signal conditioner, said first configurable memory being reprogrammable to contain different sets of signal conditioning instructions immediately at any time and being adapted for connection to an external programming device supplying the different sets of signal conditioning instructions; and a configurable analog-to-digital converter mounted on at least one other silicon base for receiving said conditioned analog signals and converting said conditioned analog signals to a plurality of digitized signals, said analog-to-digital converter including:

a second configurable memory integral to said configurable analog-to-digital converter for storing at least one signal converting instruction to direct operations of said configurable analog-to-digital converter, said second configurable memory being reprogrammable to contain different signal converting instructions immediately at any time and being adapted for connection to an external programming device supplying the different sets of signal converting instructions.

10. The apparatus of claim 9, including a digital signal processor mounted on at least one silicon base other than said first base and in communication with said configurable analog-to-digital converter for processing said digitized signals from said configurable analog-to-digital converter.

11. The apparatus of claim 10, including:

a program memory in communication with said digital signal processor for storing a plurality of program instructions for controlling the processing of said digitized signals and directing said digital signal processor to process said digitized signals, said program memory being reprogrammable to contain different program instructions for controlling and directing said digital signal processor immediately at any time and being adapted for connection to an external programming device supplying the different program instructions.

12. The apparatus of claim 11 and including:

a configuration and results bus in communication with said first configurable memory of said signal conditioner, said second configurable memory of said analog-to-digital converter, said program memory, and said digital signal processing for directing communications throughout said apparatus.

13. The apparatus of claim 12 wherein said apparatus communicates with external circuitry, said apparatus including:

a communications interface in communication with said configuration and results bus for interfacing communication signals between said apparatus and said external circuitry.

14. An intelligent programmable system for diagnostics analyses, said system comprising:

a sensor accelerometer for sensing physical variables and generating a plurality of raw signals representing said sensed physical variables;

a configurable signal conditioner for producing conditioned analog output signals in response to receiving said raw signals from said accelerometer; and a first configurable memory for storing at least one signal conditioning instruction for controlling said configurable signal conditioner, said first configurable memory being reprogrammable to contain different sets of signal conditioning instructions immediately at any time and being adapted for connection to an external programming device supplying the different sets of signal conditioning instructions;

wherein said sensor, said signal conditioner and said memory are mounted in a unitary structure.

15. The system of claim 14 wherein said unitary structure includes:

a configurable analog-to-digital converter for receiving said conditioned analog output signals and converting said conditioned analog output signals to a plurality of digitized signals;

a second configurable memory for storing at least one signal converting instruction to control said configurable analog-to-digital converter, said second configurable memory being reprogrammable to contain different signal converting instructions immediately at any time and being adapted for connection to an external programming device supplying the different sets of signal converting instructions;

a digital signal processor in communication with said configurable analog-to-digital converter for processing said digitized signals from said configurable analog-to-digital converter and producing digitally processed machine diagnostics data;

a program memory in communication with said digital signal processor for storing a plurality of program instructions for controlling the processing of said digitized signals and for directing said digital signal processor to process said digitized signals carrying said machine diagnostics data, said program memory being reprogrammable to contain different program instructions for controlling and directing said digital signal processor immediate at any time and being adapted for connection to an external programming device supplying the different program instructions;

a configuration and results bus in communication with said first configurable memory of said signal conditioner, said second configurable memory of said digital converter, said program memory, and said digital signal processor for directing communications throughout said system;

external circuitry to said unitary structure; and a communications interface in communication with said configuration and results bus for interfacing communication signals between said intelligent programmable sensor and said external circuitry.

16. The system of claim 14, including:

circuitry for monitoring said conditioned analog output signals; and circuitry controlled jointly by said signal converting instructions and by said monitored conditioned analog output signal for changing said signal conditioner.

17. The system of claim 14, wherein said sensor accelerometer, said configurable signal conditioner and said first configurable memory are mounted in a single silicon base.

18. A system for integrating intelligent programmable sensors, comprising:

a systems communications bus;

at least one transducer for sensing physical variables and generating a plurality of raw signals representing said sensed physical variables;

reprogrammable circuitry in communication with said at least one transducer for processing said raw signals and generating digital data representing said sensed physical variables, said reprogrammable circuitry residing on a single silicon base with each of said at least one transducer and said reprogrammable circuitry being reprogrammable to contain different sets of instructions immediately at any time and being adapted for connection to an external programming device supplying the different sets of instructions; and a supervisor monitor/control computer in communication among said at least one transducer via said systems communications bus.

19. The system of claim 18, including communications circuitry for directing internal communications between said reprogrammable circuitry and said at least one transducer.

20. The system of claim 19, including communications circuitry for directing external communications between said reprogrammable circuitry and said supervisor monitor/control computer.

21. A method of physical variable sensing using an intelligent programmable sensor on at least one silicon base comprising the steps of:

sensing physical variables with a transducer and generating a plurality of raw signals representing said sensed physical variables;

receiving said raw signals from said transducer in a configurable signal conditioner;

conditioning said raw signals in said configurable signal conditioner;

transmitting a plurality of conditioned signals from said configurable signal conditioner; and storing at least one signals conditioning instruction for directing operatings of said configurable signal conditioner in a first configurable memory, said storing including reprogramming said first configurable memory to contain different sets of signal conditioning instructions immediately at any time and said storing including receiving the different sets of signal conditioning instructions from an external programming device.

22. The method of claim 21, including the step of receiving said conditioned signals and converting said conditioned signals to a plurality of digitized signals in a configurable analog-to-digital converter.

23. The method of claim 22, including the step of digitally processing said digitized signals from said configurable analog-to-digital converter using a digital signal processor.

24. The method of claim 23, including the steps of storing in a program memory a plurality of program instructions for controlling the processing of said digitized signals and applying said instructions to direct said digital signal processor to process said digitized signals, said storing including reprogrammable said program memory to contain different sets of program instructions immediately at any time and said storing including receiving the different sets of program instructions from an external programming device.

25. The method of claim 23, including the step of storing at least one signal converting instruction to control said configurable analog-to-digital converter in a second configurable memory, said storing including reprogramming said second configurable memory to contain different sets of signal converting instructions immediately at any time and said storing including receiving the different sets of signal converting instructions from an external programming device.

26. The method of claim 25, including the step of directing digital signal communications among said configurable memory of said signal conditioner, said configurable memory of said analog-to-digital converter, said program memory, and digital signal processor using a configuration and results bus on a single silicon base.

27. A method of physical variable sensing that integrates intelligent programmable sensors with monitoring and control of said intelligent programmable sensors, comprising the steps of:

sensing physical variables using at least one intelligent programmable silicon sensor;

interconnecting said at least one intelligent programmable silicon sensor with a supervisor monitor/control computer; and monitoring and controlling said at least one intelligent programmable silicon sensor with said supervisor monitor/control computer, said controlling including executing instructions and said controlling including reprogramming said instructions immediately at any time.

* * * * *